United States Patent [19]

Sheldrake et al.

[11] 4,000,453
[45] Dec. 28, 1976

[54] STORAGE BATTERY CHARGING SYSTEM WITH ALTERNATOR OUTPUT FAULT INDICATING CIRCUIT

[75] Inventors: Leonard J. Sheldrake, Noblesville; Donald O. Ruff; Charles W. King, both of Anderson, all of Ind.

[73] Assignee: General Motors Corporation, Detroit, Mich.

[22] Filed: Dec. 17, 1975

[21] Appl. No.: 641,564

[52] U.S. Cl. .................................. 322/99; 320/48; 320/64
[51] Int. Cl.² ...................... H02J 7/14; H02P 9/00
[58] Field of Search ................ 322/28, 99; 320/48, 320/64, 68

[56] References Cited
UNITED STATES PATENTS

| | | | |
|---|---|---|---|
| 3,656,135 | 4/1972 | Ruff | 322/99 UX |
| 3,764,879 | 10/1973 | Hill | 322/99 X |
| 3,781,633 | 12/1973 | Iwaki et al. | 322/99 X |

Primary Examiner—Robert J. Hickey
Attorney, Agent, or Firm—Richard G. Stahr

[57] ABSTRACT

A circuit for indicating faults in a storage battery charging system of the type including a voltage regulator controlled alternator field winding switching transistor and a rectifier circuit having a diode trio which supplies alternator field winding energizing current. A differential amplifier circuit, to which is applied normally equal reference and sensing potentials which become unbalanced with alternator faults, produces a first fault indicating signal in the event of an alternator malfunction and a transistor having the control electrode connected to the output of the field winding diode trio of the rectifier circuit produces a second fault indicating signal in the event of a failure of one of these diodes. These fault indicating signals trigger a transistor conductive to complete an energizing circuit for a fault indicating device. Additionally, an oscillator flashes the fault indicating device "on" and "off" in the event of a voltage regulator failure.

5 Claims, 1 Drawing Figure

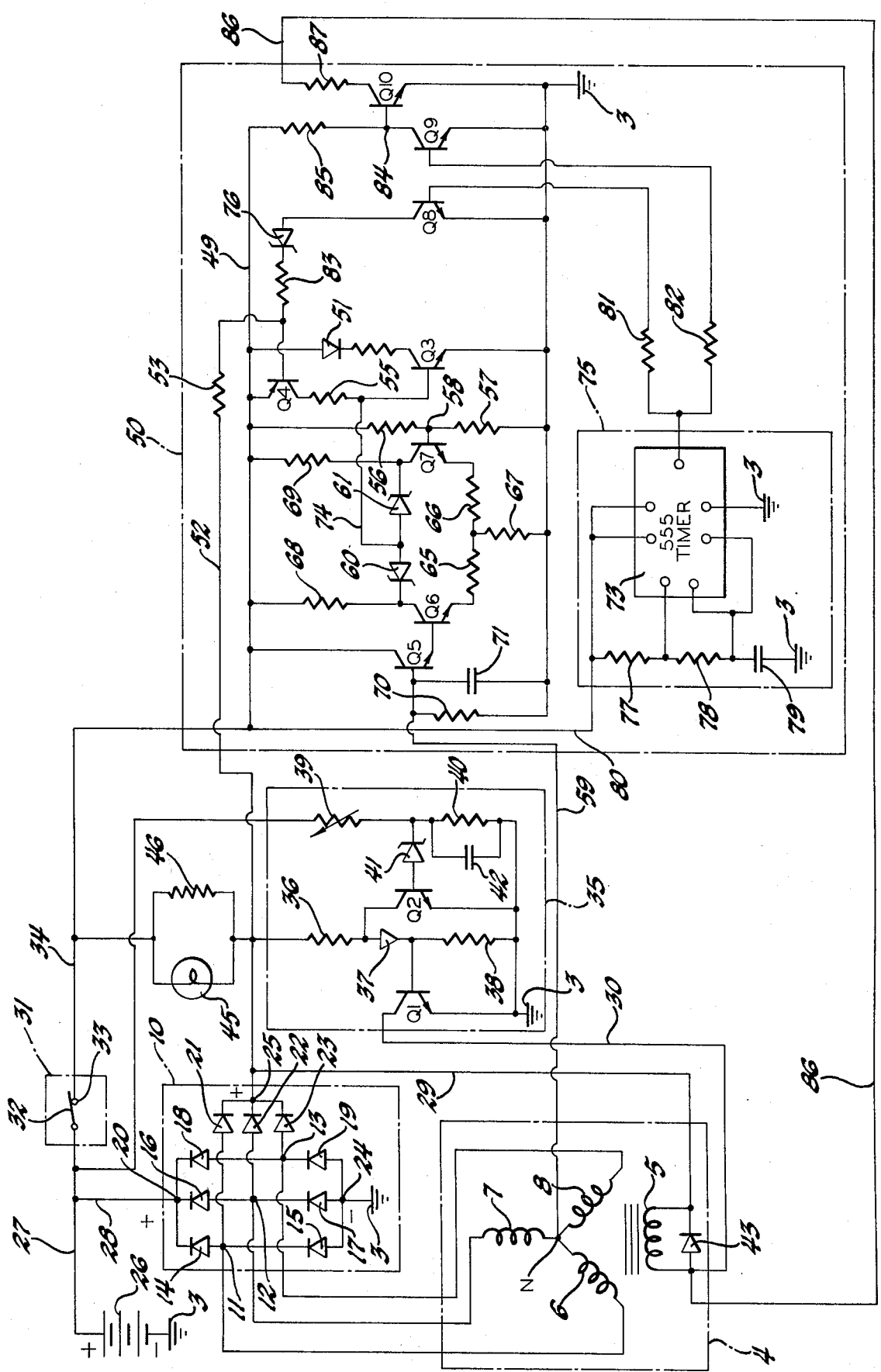

STORAGE BATTERY CHARGING SYSTEM WITH ALTERNATOR OUTPUT FAULT INDICATING CIRCUIT

The present invention relates to an improved fault indicating circuit for a storage battery charging system of the type having a voltage controlled alternator-rectifier circuit combination and, more specifically, to an improved storage battery charging system fault indicating circuit which is capable of indicating whether the fault is in the alternator-rectifier circuit combination or in the voltage regulator.

Many modern automotive type storage battery charging systems include an engine driven, three-phase alternator and a nine-diode bridge-type full-wave rectifier circuit having a three-diode negative polarity bank and two separate three-diode positive polarity banks, one of which terminates in the battery charging output terminal and the other of which terminates in the alternator field winding energizing output terminal. To facilitate fault diagnosis of the storage battery charging system, it is important that a simple and reliable fault indicating circuit be provided.

It is, therefore, an object of this invention to provide an improved storage battery charging system fault indicating circuit.

It is another object of this invention to provide an improved storage battery charging system fault indicating circuit which differentiates between alternator-rectifier circuit combination faults and voltage regulator faults.

In accordance with this invention, an improved storage battery charging system fault indicating circuit is provided wherein an electrically energizable fault indicating device switching transistor is triggered to the steady conductive state to establish the fault indicating device energizing circuit in the event of an alternator or rectifier circuit and is triggered conductive and not conductive alternately in response to the output signals of an oscillator to alternately establish and interrupt the fault indicating device energizing circuit in the event of a voltage regulator fault.

For a better understanding of the present invention, together with additional objects, advantages, and features thereof, reference is made to the following description and accompanying single FIGURE drawing which sets for the novel storage battery charging system fault indicating circuit of this invention in combination with a storage battery charging system of modern design.

As point of reference or ground potential is the same point electrically throughout the system, it has been illustrated in the drawing by the accepted schematic symbol and referenced by the numeral 3.

Referring to the drawing, the storage battery charging system fault indicating circuit of this invention is set forth in schematic form in combination with an alternator 4 having a field winding 5 and three-phase output coils 6, 7 and 8 connected in a "wye" configuration and a rectifier circuit 10 including alternating current input circuitry 11, 12 and 13 electrically interconnected with the alternator output windings 6, 7 and 8, respectively, three positive polarity bank diodes 14, 16 and 18 terminating in positive polarity battery charging circuit output terminal 20, a diode trio 21, 22 and 23 terminating in positive polarity alternator field winding energizing circuit output terminal 25 and three negative polarity bank diodes 15, 17 and 19 terminating in common negative polarity output terminal 24 connected to point of reference or ground potential 3. The storage battery 26 to be charged is connected across the rectifier circuit battery charging circuit output terminal 20 and common output terminal 24 through leads 27 and 28 and point of reference or ground potential 3 and the alternator field winding 5 is connected acros the rectifier circuit alternator field winding energizing circuit output terminal 25 and common output terminal 24 through lead 29 and lead 30 and the current carrying electrodes of NPN alternator field switching transistor Q1 of voltage regulator circuit 35 and point of reference or ground potential 3.

Single-pole, single-throw electrical switch 31 having a moveable contact 32 and a stationary contact 33 may be the normally open ignition circuit contacts of a conventional automotive type ignition switch. With movable contact 32 of switch 31 closed to stationary contact 33, as illustrated in the drawing, battery potential appears across leads 34 and 49 and point of reference or ground potential 3.

While switch 31 is closed, current from battery 26 flows through the parallel combination of battery charge indicator lamp 45 and resistor 46, resistor 36 and diode 37 of voltage regulator circuit 35 in series, the parallel combination of the base-emitter electrodes of alternator field switching transistor Q1 and resistor 38 and through point of reference or ground potential 3 to the negative polarity terminal of battery 26. The flow of base-emitter current through resistor 36 and diode 37 to switching transistor Q1 renders this device conductive through the collector-emitter or current carrying electrodes thereof to complete an energizing circuit for alternator field winding 5 which may be traced from the rectifier circuit 10 alternator field winding energizing circuit output terminal 25, lead 29, alternator field winding 5, lead 30, the collector-emitter electrodes of transistor Q1, and point of reference or ground potential 3 to the rectifier circuit 10 common output terminal 24. At this time, the battery charging indicator lamp 45 is illuminated through an energizing circuit which may be traced from the positive polarity terminal of battery 26, lead 27, closed electrical switch 31, lead 34, the parallel combination of battery charge indicating lamp 45 and resistor 46, resistor 36, diode 37 and the parallel combination of resistor 38 and the base-emitter electrodes of transistor Q1 of voltage regulator circuit 35 and point of reference or ground potential 3 to the negative polarity terminal of battery 26. Resistor 46 is provided in parallel with battery charging indicating lamp 45 to reduce the total circuit resistance to provide higher alternator field winding 5 energizing current for initial voltage buildup while the associated engine is cranked. while generator 4 is being driven by an associated engine, the alternating current potential induced in wye connected stator windings 6, 7 and 8 is full-wave rectified by the diode trio 21, 22 and 23 and negative polarity bank diodes 15, 17 and 19 to provide energizing current for alternator field winding 5. At the same time, the positive polarity bank diodes 14, 16 and 18 of rectifier circuit 10 provide an equal positive polarity potential upon rectifer circuit battery charging circuit output terminal 20. While alternator 4 is operating normally, therefore, substantially equal positive polarity potentials appear on opposite sides of the parallel combination of battery charge indicating lamp 45 and resistor 46, consequently, battery charge indicating lamp 45 extinguishes to indicate that generator 4 is producing an output potential. The series combination of variable resistor 39 and fixed resistor 40 is always connected across battery 26, however, the current flow is limited to a negligible amount by the high resistance values of resistors 39 and 40. As the alternator speed and output potential increases, the potential upon junction 48 between resistors 39 and 40 increases to a value equal to the inverse breakdown potential of Zener diode 41 which then conducts in a reverse direction to supply base drive current to NPN transistor Q2. While base drive current is supplied to NPN transistor Q2, this device conducts through the collector-emitter electrodes to drain base drive current from NPN alternator field switching transistor Q1, a condition which extinguishes transistor Q1. With transistor Q1 extinguished, the alternator field winding 5 energizing current and, consequently, system output potential decreases to the point at which Zener diode 41 again blocks the flow of base drive current to transistor Q2, extinguishing this device thereby permitting alternator field switching transistor Q1 to again conduct. This cycle repeats many times per second to limit the alternator output potential to a preset value. Capacitor 42 smooths the potential across resistor 40 and diode 43 prevents high induced voltages in the alternator field winding 5 when transistor Q1 turns off. Resistor 39 may be a thermistor which regulates the output potential with temperature thus providing optimum output potential for charging battery 26.

The novel storage battery charging system fault indicator circuit 50 of this invention includes an electrically energizable fault indicating device which may be a light emitting diode 51 or any other selected electrically energizable fault indicating device; a fault indicating device NPN switching transistor Q3 having a control electrode, the base electrode, and two current carrying electrodes, the collector and emitter electrodes, connected in series with the fault indicating light emitting diode 51 across a source of energizing potential which may be battery 26 and/or the battery charging circuit output terminal 20 and common output terminal 24 of rectifier circuit 10; a PNP transistor Q4 having the control electrode thereof, the base electrode, connected to the one of the rectifier circuit 10 output terminals to which alternator field winding 5 is connected, alternator field winding energizing circuit output terminal 25, through lead 52 and current limiting resistor 53 and two current carrying electrodes, the emitter and collector electrodes, connected across lead 49 and point of reference or ground potential 3 through collector resistor 55 and the base-emitter electrodes of NPN transistor Q3 in series in the proper electrical polarity relationship for forward conduction therethrough; series resistors 56 and 57 connected across lead 49 and point of reference or ground potential 3 for producing a reference potential upon junction 58 of a predetermined direct current potential level as determined by the proportions of resistors 56 and 57; an NPN transistor Q5 having a control electrode, the base electrode, connected to the neutral point N of the wye connected output coils 6, 7 and 8 of alternator 4 through lead 59 for producing a sensing potential of a direct current potential level directly proportional to the direct current output potential of rectifier circuit 10 and, in the absence of an alternator fault, substantially equal to the reference potential upon junction 58; and differentially connected NPN transistors Q6 and Q7, connected as a differential amplifier circuit, and Zener diodes 60 and 61 responsive to the reference and sensing potentials for producing a fault indicating output signal when the direct current potential level of either exceeds the direct current potential level of the other.

The emitter electrodes of NPN transistors Q6 and Q7 are connected to point of reference or ground potential 3 through respective resistors 65 and 66 and common emitter resistor 67 and the collector electrodes thereof, serving as the output terminals of the differential amplifier circuit, are connected to conductor 49 through respective collector resistors 68 and 69. The base electrode of transistor Q6 is connected to the emitter electrode of amplifier transistor Q5. As the base electrode of transistor Q5 is connected through lead 59 to the neutral point N of the wye connected output stator windings 6, 7 and 8 of alternator 4, the emitter potential of transistor Q5 is a sense potential which, during normal operation, is directly proportional to the direct current output potential of rectifier circuit 10. Resistor 70 and capacitor 71 comprise a filter circuit for smoothing the input potential to the base electrode of transistor Q5. In the absence of an alternator malfunction, the potential across the alternator stator winding neutral point N and point of reference or ground potential 3 remains substantially constant and is a known proportion of the output potential across the positive polarity output terminals of the rectifier circuit 10 and point of reference or ground potential 3. The base electrode of transistor Q7 is connected to junction 58 between resistors 56 and 57. The reference potential appearing across junction 58 and point of reference or ground potential 3 remains within a predetermined range in the absence of an alternator malfunction. The values of resistors 56 and 57 are so proportioned that, with normal satisfactory operation of the alternator portion of the charging system and battery, the reference potential input to the base electrode of transistor Q7 balances the sense potential input to the base electrode of transistor Q6. The resistance values of resistors 67, 68 and 69 are so proportioned that the peak potentials upon the collector electrode of transistors Q6 and Q7 with balanced operating conditions are slightly less than the inverse breakdown potential of the Zener diodes 60 and 61. The anodes of Zener diodes 60 and 61 are connected through lead 74 to the base electrode of fault indicating device switching transistor Q3 and the cathodes thereof connected respectively to the collector electrode of transistors Q6 and Q7. As is well known in the art, common emitter resistor 67 functions as a feedback resistor to both transistors Q6 and Q7 whereby current flow through either provides a potential drop across resistor 67 in a direction to negatively bias the emitter electrode of the other, thereby reducing current flow therethrough. Consequently, if the potential introduced upon the base of transistor Q6 is greater than that introduced upon the base of transistor Q7, an increased current will flow through transistor Q6 and a decreased current will flow through transistor Q7. Conversely, if the potential introduced upon the base of transistor Q7 is greater than that introduced upon the base of transistor Q6, an increased current will flow through transistor Q7 and a decreased current will flow through transistor Q6. A change of the magnitude of the input potential to the base of either transistor Q6 or Q7, therefore, produces an increase of potential upon the collector electrode of the lesser conducting of the two transistors by an amount significantly greater than that upon the collector electrode of the greater conducting transistor.

In the event that the alternating current component which provides the sense potential should exceed a predetermined level, as may be the result of an open stator winding especially with increasing loads, the potentials induced in the individual stator windings 6, 7 and 8 would become unbalanced or unsymmetrical as they adjust to different load. The resultant potential in the individual windings would therefore have a higher alternating current component. This increase in the alternating current component of the potential sense across the neutral point N of the wye connected stator windings and point of reference or ground potential 3 is applied to the base electrode of transistor Q6. This increased alternating current component would cause the potential upon the collector electrodes of transistors Q6 and Q7 to alternately increase to a magnitude greater than the inverse breakdown potential of Zener diodes 60 and 61. As with the overvoltage condition, fault indicator device switching transistor Q3 would be triggered conductive to complete the energizing circuit for light emitting diode 51.

An open or shorted rectifier circuit diode would also result in an increase or a decrease of the direct current potential level of the sense potential. This condition would unbalance the differential amplifier so that the amplifier output voltage at the collector of transistor Q7 would increase to break down Zener diode 61 and supply base drive current to fault indicator device switching transistor Q3 to trigger this device conductive through the collector-emitter electrodes and complete the previously described energizing circuit for light emitting diode 51.

While the storage battery charging system is operating normally, the potential upon lead 52 and upon lead 49 are of substantially the same magnitude. Consequently, the emitter and base electrodes of transistor Q4 are at substantially the same potential, a condition which maintains transistor Q4 not conductive. In the event one or more of the diodes of diode trio 21, 22 and 23 become open, the potential upon lead 49 would exceed that upon lead 52. Consequently, emitter-base drive current would be supplied to transistor Q4 from lead 49 through the emitter-base electrodes of transistor Q4, resistor 53, lead 52, resistor 36, diode 37 and resistor 38 to point of reference or ground potential 3. While base drive current is supplied to transistor Q4, this device conducts through the emitter-collector electrodes thereof to provide another fault indicating output signal which is applied to the base electrode of fault indicator device switching transistor Q3 in the proper polarity relationship to supply base drive current thereto. While base drive current is supplied to transistor Q3, this device conducts through the collector-emitter electrodes to complete the previously described energizing circuit of light emitting diode 51.

The novel storage battery charging system fault indicating circuit 50 of this invention also includes circuitry for detecting and indicating voltage regulator faults. This circuitry includes an oscillator circuit 75, NPN transistors Q8, Q9 and Q10 and Zener diode 76. In an actual application of the circuit of this invention, a commercially available type 555 integrated circuit timer, illustrated in block form in the drawing and referenced by the numeral 73, adapted to function as a free running oscillator of a frequency determined by the resistance and capacitance values of external resistors 77 and 78 and capacitor 79 was employed. The type 555 integrated circuit timer is a commercially available logic circuit element, one example of which is a type LM555 unit marketed by National Semiconductor Corporation. It is to be specifically understood, however, that other type oscillator circuits may be employed without departing from the spirit of the invention.

Operating potential is supplied to oscillator circuit 75 through lead 80 and the output signal thereof is applied across the base-emitter electrodes of NPN transistor Q8 through current limiting resistor 81 and across the base-emitter electrodes of NPN transistor Q9 through current limiting resistor 82. Alternator 10 output potential is applied across the series combination of Zener diode 76 and the collector-emitter electrodes of NPN transistor Q8 through a circuit which may be traced from output terminal 20 of rectifier circuit 10 through lead 28, switch 31, leads 34 and 49, the emitter-base electrodes of PNP transistor Q4, current limiting resistor 83, oppositely poled Zener diode 76 and the collector-emitter electrodes of NPN transistor Q8 to point of reference or ground potential 3. The base electrode of NPN transistor Q10 is connected to junction 84 between collector resistor 85 and the collector electrode of NPN transistor Q9. The negative polarity side of alternator field winding 5 is connected to point of reference or ground potential 3 through lead 86, collector resistor 87 and the collector-emitter electrodes of NPN transistor Q10.

With a fault occcurring alternator 10, the resulting first fault indicating signal produced by the differential amplifier circuit in a manner previously explained maintains light emitting diode 51 energized or illuminated constantly or in a steady mode and in the event of one or more open diodes of the diode trio 21, 22 and 23, which supplies energizing current to alternator field winding 5, the second fault indicating signal produced by transistor Q4 maintains light emitting diode 51 energized or illuminated constantly or in a steady mode. Should a fault occur in voltage regulator circuit 35 which would result in alternator field winding switching transistor Q1 remaining in the conducting mode, such as a shorted switching transistor Q1 or an open transistor Q2 or Zener diode 41, or should a fault occur in voltage regulator circuit 35 which would result in the alternator field winding switching transistor Q1 remaining in the not conducting mode, such as an open field winding switching transistor Q1 or an open resistor 36 or diode 37, light emitting diode 51 is flashed "on" or "off" at a frequency determined by the frequency of the output signal of oscillator circuit 75.

The negative polarity side of field winding 5 of alternator 4 is provided with two parallel circuits to point of reference or ground potential 3, one of which is through lead 30 and the collector-emitter electrodes of field winding switching transistor Q1 of voltage regulator circuit 35 and the other of which is through lead 86, collector resistor 87 and the collector-emitter electrodes of transistor Q10 of fault indicating circuit 50. During normal operation, transistor Q9 is triggered conductive through the collector-emitter electrodes during each positive polarity excursion of the output signals of oscillator circuit 75 and is not conductive during each negative polarity excursion thereof. During the periods transistor Q9 is not conductive, base-emitter drive current is supplied to NPN transistor Q10 from battery 26 or from rectifier circuit 10 through lead 49 and current limiting resistor 85; and during the periods transistor Q9 is conductive, base-emitter drive current is drained away from transistor Q10 through the collector-emitter electrodes of conducting transistor Q9. Therefore, during periods of normal operation, transistor Q10 conducts through the collector-emitter electrodes to complete a path for alternator field winding 5 to point of reference or ground potential 3 in parallel with the collector-emitter electrodes of field winding switching transistor Q1 of voltage regulator 35.

A fault occurring because of an open one or more diodes of the diode trio 21, 22 or 23 supplying alternator field winding 5 energizing current results in an energization of light emitting diode 51 in a steady mode, as previously described, since the potential upon lead 52 would be less than that upon lead 49 at all times including the periods of conduction of transistors Q1 and/or Q10. A fault in alternator 4 also results in an energization of light emitting diode 51 in a steady mode, as previously described, since the fault signal produced by the differential amplifier is present regardless of the periods of conduction and not conduction of transistors Q1 and Q10.

In the event of a voltage regulator circuit 35 fault which results in alternator field winding switching transistor Q1 remaining in the not conducting mode, the potential upon lead 52 would be less than that upon lead 49 during the periods transistor Q10 is in the not conducting mode and the potential upon lead 52 would be equal to the potential upon lead 49 during the periods transistor Q10 is in the conducting mode to complete the alternator for field winding 5 energizing circuit. Therefore, light emitting diode 51 would be energized or illuminated, in a manner previously explained, during the periods transistor Q10 is in the not conducting mode. Consequently, light emitting diode 51 is flashed on and off at the frequency of the output signals of oscillator circuit 75 indicating a voltage regulator circuit 35 fault.

In the event of a voltage regulator circuit 35 fault which results in field winding switching transistor Q1 remaining in the conductive mode, a shorted regulator, the output potential of alternator 4 and, consequently, rectifier circuit 10 increases above normal which tends to overcharge battery 26. With these conditions, the collector potential of both transistors Q6 and Q7 increases in a magnitude proportional to the overpotential as does the magnitude of both the reference and sense potentials. The increase of reference and sense potentials are equal and, therefore, maintain differential amplifier circuit 35 balance. Zener diode 76 is selected to have a breakdown potential lower than that of Zener diodes 60 and 61, consequently, before Zener diodes 60 and 61 break down and conduct with overpotential conditions that do not result in an imbalance of differential amplifier circuit 35, Zener diode breaks down and conducts. When the output potential has increased to a value equal to the inverse breakdown potential of Zener diode 76, system potential is applied across the collector-emitter electrodes of NPN transistor Q8 in the proper polarity relationship for forward collector-emitter conduction through an NPN transistor. During each positive polarity excursion of the output signals of oscillator circuit 75, therefore, base-emitter drive current is supplied to NPN transistor Q8 to trigger this device conductive through the collector-emitter electodes. During the periods of conduction of transistor Q8, emitter-base drive current is supplied to transistor Q4 from lead 49, through the emitter-base electrodes of PNP transistor Q4, resistor 83, Zener diode 76 and the collector-emitter electrodes of NPN transistor Q8 to point of reference or ground potential 3. While emitter-base drive current is supplied to PNP transistor Q4, this device conducts through the emitter-collector electrodes thereof to supply base-emitter drive current to fault indicating device switching transistor Q3 to trigger this device conductive and complete the energizing circuit for light emitting diode 51, previously explained. Therefore, with voltage regualtor circuit faults resulting in alternator field winding 5 energizing circuit switching transistor Q1 of voltage regulator circuit 35 remaining in the conducting mode, light emitting diode 51 is flashed on and off at the frequency of the output signals of oscillator circuit 76 indicating a voltage regulator fault.

From this description, it is apparent that the novel storage battery charging system fault indicating circuit of this invention provides not only an indication of system faults but also differentiates between alternator-rectifier circuit faults and voltage regulator circuit faults.

While a preferred embodiment of the present invention has been shown and described, it will be obvious to those skilled in the art that various modifications and substitutions may be made without departing from the spirit of the invention which is to be limited only within the scope of the appended claims.

What is claimed is:

1. In a storage battery charging system of the type having an alternator including a field winding and alternating current output circuitry interconnected with a rectifier circuit having separate battery charging and alternator field winding energizing circuit outputs and a voltage regulator controlled alternator field winding switching transistor for establishing an alternator field winding energizing circuit across the alternator field winding energizing circuit output of the rectifier circuit, a system fault indicating circuit comprising:

an electrically energizable fault indicating device;
a fault indicating device switching transistor having a control electrode and two current carrying electrodes connected in series with said fault indicating device across a source of energizing potential;
means for producing a reference potential of a predetermined direct current potential level;
means for producing a sensing potential of a direct current potential level directly proportional to the direct current output potential of said rectifier circuit and, in the absence of an alternator fault, substantially equal to said reference potential;
means responsive to said reference and sensing potentials for producing a first fault indicating signal when the direct current potential level of either exceeds the direct current potential level of the other;
means for producing a second fault indicating signal when activated;
first circuit means for activating said means for producing a second fault indicating signal when the potential across said alternator field winding energizing circuit output of said rectifier circuit falls below a predetermined magnitude;
an oscillator circuit for producing output signals of a selected frequency;

second circuit means for periodically activating said means for producing a second fault indicating signal in response to the output signals of said oscillator circuit when system output potential exceeds a predetermined maximum;

circuit means for periodically establishing an alternate alternator field winding energizing circuit across the alternator field winding energizing circuit output of said rectifier circuit in response to the output signals of said oscillator circuit; and means for applying said first and second fault indicating signals to said control electrode of said fault indicating device switching transistor in the proper polarity relationship to trigger this device conductive through said current carrying electrodes thereof whereby said fault indicating device is energized upon the occurrence of a charging system fault.

2. In a storage battery charging system of the type having an alternator including a field winding and alternating current output circuitry interconnected with a rectifier circuit having separate battery charging and alternator field winding energizing circuit outputs and a voltage regulator controlled alternator field winding switching transitor for establishing an alternator field winding energizing circuit across the alternator field winding energizing circuit output of the rectifier circuit, a system fault indicating circuit comprising:

an electrically energizable fault indicating device;

a fault indicating device switching transistor having a control electrode and two current carrying electrodes connected in series with said fault indicating device across a source of energizing potential;

means for producing a reference potential of a predetermined direct current potential level;

means for producing a sensing potential of a direct current potential level directly proportional to the direct current output potential of said rectifier circuit and, in the absence of an alternator fault, substantially equal to said reference potential;

a differential amplifier circuit responsive to said reference and sensing potentials for producing a first fault indicating signal when the direct current potential level of either exceeds the direct current potential level of the other;

a transistor for producing a second fault indicating signal when activated;

first circuit means for activating said transistor when the potential across said alternator field winding energizing circuit output of said rectifier circuit falls below a predetermined magnitude;

an oscillator circuit for producing output signals of a selected frequency;

second circuit means for periodically activating said transistor in response to the output signals of said oscillator circuit when system output potential exceeds a predetermined maximum;

circuit means for periodically establishing an alternate alternator field winding energizing circuit across the alternator field winding energizing circuit output of said rectifier circuit in response to the output signals of said oscillator circuit; and means for applying said first and second fault indicating signals to said control electrode of said fault indicating device switching transistor in the proper polarity relationship to trigger this device conductive through said current carrying electrodes thereof whereby said fault indicating device is energized upon the occurrence of a charging system fault.

3. In a storage battery charging system of the type having an alternator including a field winding and alternating current output circuitry interconnected with a rectifier circuit having separate battery charging and alternator field winding energizing circuit outputs and a voltage regulator controlled alternator field winding switching transistor for establishing an alternator field winding energizing circuit across the alternator field winding energizing circuit output of the rectifier circuit, a system fault indicating circuit comprising:

an electrically energizable fault indicating device;

a fault indicating device switching transistor having a control electrode and two current carrying electrodes connected in series with said fault indicating device across a source of energizing potential;

means for producing a reference potential of a predetermined direct current potential level;

means for producing a sensing potential of a direct current potential level directly proportional to the direct current output potential of said rectifier circuit and, in the absence of an alternator fault, substantially equal to said reference potential;

means responsive to said reference and sensing potentials for producing a first fault indicating signal when the direct current potential level of either exceeds the direct current potential level of the other;

a transistor for producing a second fault indicating signal when activated;

first circuit means for activating said transistor when the potential across said alterator field winding energizing circuit output of said rectifier circuit falls below a predetermined magnitude;

an oscillator circuit for producing output signals of a selected frequency;

second circuit means including a Zener diode for periodically activating said means for producing a second fault indicating signal in response to the output signals of said oscillator circuit when system output potential exceeds a predetermined maximum;

circuit means for periodically establishing an alternate alternator field winding energizing circuit across the alternator field winding energizing circuit output of said rectifier circuit in response to the output signals of said oscillator circuit; and means for applying said first and second fault indicating signals to said control electrode of said fault indicating device switching transistor in the proper polarity relationship to trigger this device conductive through said current carrying electrodes thereof whereby said fault indicating device is energized upon the occurrence of a charging system fault.

4. In a storage battery charging system of the type having an alternator including a field winding and alternating current output circuitry interconnected with a rectifier circuit having separate battery charging and alternator field winding energizing circuit output circuits and a voltage regulator controlled alternator field winding switching transistor for establishing an alternator field winding energizing circuit across the alternator field winding energizing circuit output of the rectifier circuit, a system fault indicating circuit comprising:

an electrically energizable fault indicating device;

a fault indicating device switching transistor having a control electrode and two current carrying electrodes connected in series with said fault indicating device across a source of energizing potentials;
means for producing a reference potential of a predetermined direct current potential level;
means for producing a sensing potential of a direct current potential level directly proportional to the direct current output potential of said rectifier circuit and, in the absence of an alternator fault, substantially equal to said reference potential;
means responsive to said reference and sensing potentials for producing a first fault indicating signal when the direct current potential level of either exceeds the direct current potential level of the other;
a transistor having a base electrode and two current carrying electrodes for producing a second fault indicating signal when activated;
means for connecting said battery charging and alternator field winding energizing circuit output circuits of said rectifier circuit across said base electrode and a selected one of said current carrying electrodes of said transistor in such a manner that base drive current is supplied through said transistor when the potential across said alternator field winding energizing circuit output circuit of said rectifier circuit falls below a predetermined magnitude;
an oscillator circuit for producing output signals of a selected frequency;
second circuit means including a Zener diode for periodically supplying base drive current to said transistor in response to the output signals of said oscillator circuit when system output potential exceeds a predetermined maximum;
circuit means for periodically establishing an alternate alternator field winding energizing circuit across the alternator field winding energizing circuit output of said rectifier circuit in response to the output signals of said oscillator circuit; and
means for applying said first and second fault indicating signals to said control electrode of said fault indicating device switching transistor in the proper polarity relationship to trigger this device conductive through said current carrying electrodes thereof whereby said fault indicating device is energized upon the occurrence of a charging system fault.

5. In a storage battery charging system of the type havng having alternator including a field winding and alternating current output circuitry interconnected with a rectifier circuit having separate battery charging and alternator field winding energizing circuit output circuits and a voltage regulator controlled alternator field winding switching transistor for establishing an alternator field winding energizing circuit across the alternator field winding energizing circuit output of the rectifier circuit, a system fault indicating circuit comprising:
an electrically energizable fault indicating device;
a fault indicating device switching transistor having a control electrode and two current carrying electrodes connected in series with said fault indicating device across a source of energizing potential;
means for producing a reference potential of a predetermined direct current potential level;
means for producing a sensing potential of a direct current potential level directly proportional to the direct current output potential of said rectifier circuit and, in the absence of an alternator fault, substantially equal to said reference potential;
means responsive to said reference and sensing potentials for producing a first fault indicating signal when the direct current potential level of either exceeds the direct current potential level of the other;
a first transistor having a base electrode and two current carrying electrodes for producing a second fault indicating signal when activated;
means for connecting said battery charging and alternator field winding energizing circuit output circuits of said rectifier circuit across said base electrode and a selected one of said current carrying electrodes of said first transistor in such a manner that base electrode drive current is supplied to said transistor when the potential across said alternator field winding energizing circuit output circuit of said rectifier circuit falls below a predetermined magnitude;
a Zener diode;
a second transistor having a base electrode and two current carrying electrodes;
an oscillator circuit for producing output signals of a selected frequency;
means for connecting said battery charging output circuit of said rectifier circuit across the series combination of said Zener diode and said current carrying electrodes of said second transistor in the polarity sense which will provide base electrode drive current to said first transistor when system output potential exceeds a predetermined maximum;
means for applying said output signals of said oscillator circuit across said base electrode and a selected one of said current carrying electrodes of said second transistor in a polarity sense to provide base electrode drive current to said second transistor;
circuit means for periodically establishing an alternate alternator field winding energizing circuit across the alternator field winding energizing circuit output of said rectifier circuit in response to the output signals of said oscillator circuit; and
means for applying said first and second fault indicating signals to said control electrode of said fault indicating device switching transistor in the proper polarity relationship to trigger this device conductive through said current carrying electrodes thereof whereby said fault indicating device is energized upon the occurrence of a charging system fault.

* * * * *